United States Patent
Paw et al.

(10) Patent No.: US 7,192,886 B2
(45) Date of Patent: Mar. 20, 2007

(54) METHOD FOR USING ADDITIVES IN THE CAUSTIC ETCHING OF SILICON FOR OBTAINING IMPROVED SURFACE CHARACTERISTICS

(75) Inventors: Wiltold Paw, New Fairfield, CT (US); Jonathan Wolk, Bridgewater, CT (US)

(73) Assignee: Intersurface Dynamics, Inc., Bethel, CT (US)

( * ) Notice: Subject to any disclaimer, the term of this patent is extended or adjusted under 35 U.S.C. 154(b) by 186 days.

(21) Appl. No.: 10/692,661

(22) Filed: Oct. 24, 2003

(65) Prior Publication Data

US 2004/0089419 A1    May 13, 2004

(51) Int. Cl.
*H01L 21/302*    (2006.01)

(52) U.S. Cl. ............ 438/753; 438/745; 438/750; 134/1.1

(58) Field of Classification Search ............ 438/745, 438/750, 753; 134/1.1, 1.2
See application file for complete search history.

(56) References Cited

U.S. PATENT DOCUMENTS

| | | | | |
|---|---|---|---|---|
| 5,466,389 A | * | 11/1995 | Ilardi et al. | 510/175 |
| 5,714,407 A | * | 2/1998 | Maeno et al. | 438/701 |
| 6,431,186 B1 | * | 8/2002 | Morita et al. | 134/1.3 |
| 6,458,289 B1 | * | 10/2002 | Merchant et al. | 252/79.1 |
| 6,641,630 B1 | * | 11/2003 | Sun | 51/307 |
| 2001/0044264 A1 | * | 11/2001 | Lack et al. | 451/60 |

* cited by examiner

*Primary Examiner*—Lan Vinh
(74) *Attorney, Agent, or Firm*—Scott Wofsy; George N. Chaclas; Edwards Angell Palmer & Dodge, LLP

(57) ABSTRACT

A method for the caustic etching of silicon which is of importance for the semiconductor industry and silicon wafer manufacture in particular, that includes using one or more iodate or chlorite salts as additives in the etching process to achieve improved surface conditions, such as smaller facets and lower roughness, on the resulting silicon substrate.

13 Claims, 2 Drawing Sheets

METHOD FOR USING ADDITIVES IN THE CAUSTIC ETCHING OF SILICON FOR OBTAINING IMPROVED SURFACE CHARACTERISTICS

BACKGROUND OF THE INVENTION

1. Field of the Invention

The subject invention is directed to a method for etching silicon to achieve desirable surface characteristics, and more particularly, to a method of using additives in the caustic etching process of silicon to, among other things, reduce the relative roughness of the silicon surface.

2. Background of the Related Art

Wet etching is one of the processes used to manufacture silicon wafers. Lapped wafers are subjected to wet etching to clean post-lapped surfaces and to eliminate the subsurface damage by removing a layer of silicon.

Although many different etching formulations are known and used, they can be grouped into two basic types. The first type is referred to as acid etching, which involves the use of hydrofluoric and nitric acids with water and/or acetic acid as diluents. The second type is referred to as caustic etching, which involves the use of alkali metal hydroxides.

Due to the nature of the chemical reactions between the active reagents and silicon surface, quite different wafers are produced depending on which of these two etchants are used. Despite the variety of formulations with different properties, the isotropic acid process is generally said to be diffusion controlled, yielding relatively smooth surface that are free of features (i.e., unfaceted). However, there is a relatively poor uniformity of silicon removal across the wafer, which results in significant total thickness variation (TTV).

The anisotropic caustic process is said to be reaction controlled and even though it is characterized by a good uniformity of silicon removal (i.e., a low TTV), it suffers from a surface topography generated (i.e., a faceted surface) and much higher roughness.

The higher roughness of wafers obtained from caustic etching results from the characteristic features (or facets) that form on a surface, such as squares (or pillows) for a (100) wafer and triangles for a (111) wafer. The size of these features increases with the amount of silicon etched and can be significant. For example, the squares on a surface of a (100) wafer with 25 μm of silicon etched (12.5 μm on each side) can have edges of ca. 20 μm.

It is highly desirable to obtain silicon wafers characterized by a good uniformity across the wafer and a surface with low roughness. One possibility is to find additives to the caustic process that would affect the etching and produce smoother surfaces. Technical literature, as well as industrial R&D practice, indicate that there have been numerous attempts to accomplish this goal. Isopropanol was the most often mentioned additive, which, according to these sources, was seemingly found to reduce roughness. However, the improvements were not significant. Furthermore, the practical difficulties associated with using isopropanol at elevated temperatures rendered using isopropanol a nonviable option.

Other additives were reported to change the appearance of the etched surface, but only to a small extent. More specifically, in the case of (100) wafers, some rounding of the squares was noticed, without changing the size and orientation of these features. However, none of the additives provided a desirable level of change to the faceted appearance and roughness of the silicon surface produced from the caustic process. In the quest to produce flatter and smoother wafers, silicon wafer manufacturers continually consider modifications to the acid process that would result in improved wafer geometry, but have had problems developing a successful, practical modification.

An alternative solution to this problem would be to improve the caustic process in a way that would result in wafers with lower roughness. What is needed is an additive that would reduce the size of the features on the wafer surface, since surface roughness is proportional to the size of features on the surface. Thus, the present invention advantageously provides a solution, which is practical and successful, that employs an additive and method of using the additive in conjunction with a caustic etching process to produce a silicon wafer having improved surface characteristics, such as reduced surface features, among other things.

SUMMARY OF THE INVENTION

The present invention provides a method for producing silicon wafers with reduced surface features, among other things, using one or more additives in a caustic etching process. In particular, the present invention is directed to a caustic etching process for silicon using iodate and/or chlorite salts as additives. The iodate salt may consist of potassium iodate ($KIO_3$), sodium iodate ($NaIO_3$), lithium iodate ($LiIO_3$), or a mixture thereof. The chlorite salt may consist of sodium chlorite ($NaClO_2$). Furthermore, other iodate or chlorite salts, mixtures thereof, or like compounds may function with the process in accordance with the present invention. The additives (i.e., the aforementioned salts or mixtures thereof) may be incorporated in the etching process in various amounts, preferably, from at least 0.01% to about 99.9% by weight. The additives themselves may be prepared by chemical reaction or otherwise, independently prior to being incorporated in the etching process, or in-situ (i.e., in or during the silicon etching process itself) as desired.

In particular, the present invention is directed to a method for producing silicon wafers with improved surface features that includes the steps of supplying a substrate fabricated substantially of silicon, and exposing the substrate to an etching bath with a caustic etching solution including an additive, wherein the additive is a chlorite salt, an iodate salt, or a mixture thereof. For example, the additive of embodiments discussed herein can be potassium iodate, sodium iodate, a mixture of potassium iodate and sodium iodate, sodium chlorite, or mixtures thereof, but other iodates and chlorites can be used in accordance with the present invention.

The method of the present invention can also include the step of forming the additive by chemical reaction in the etching bath. In one embodiment, the reaction in the etching bath is between iodic acid and hydroxide. In another embodiment, the additive is formed by oxidation of $I_2$ with chlorate in the etching bath.

The method of the present invention can also include the steps of removing a portion of the solution from the etching bath, exposing the portion of removed solution to the additive and returning the exposed portion of removed solution to the etching bath.

The process in accordance with the present invention provides benefits such as improved smoothness of the silicon surface resulting from smaller facets which results in improved quality of silicon wafers (e.g., etched-only back side of wafers will have a smoother surface); reducing the duration of the acid etching step and thus, wafers will have better TTVs, while the use of hazardous chemicals (especially hydrofluoric acid) will be reduced; and in the reduction of duration of the polish step saving time and expense associated with using abrasives.

An additional benefit stems from the fact that after etching with the additive in accordance with the present invention, the wafer surface is fundamentally the same when compared with a wafer etched in accordance with commonly used etching techniques (i.e., the wafers produced with the method of the present invention still have the "caustic look"). This may be an important issue to the recipients of the wafers. Many such recipients desire smoother wafers but require that everything else stay the same, including the caustic look.

These and other aspects of the method of the present invention will become more readily apparent to those having ordinary skill in the art from the following detailed description of the present invention taken in conjunction with the figures.

BRIEF DESCRIPTION OF THE FIGURES

So that those having ordinary skill in the art to which the present invention pertains will more readily understand how to use the present invention, embodiments thereof will be described in detail with reference to the drawings, wherein.

DETAILED DESCRIPTION OF THE PREFERRED EMBODIMENTS

Figure 1:
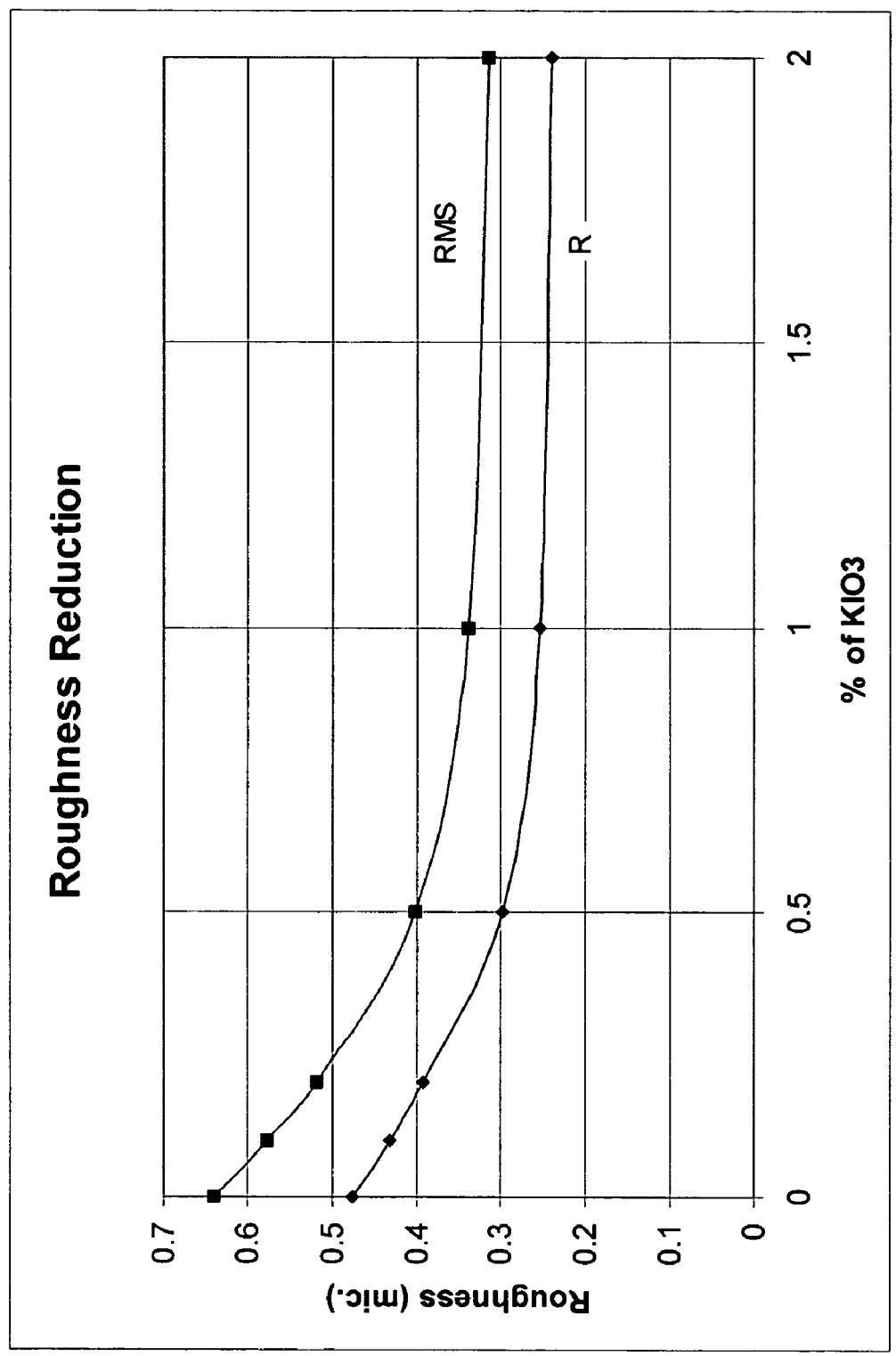
FIG. 1 is a graphical depiction of the data provided in Table 1, illustrating an example of the beneficial results obtained by conducting an etching process according to the method of the present invention, and in particular, the roughness reduction vs. the concentration of $KIO_3$ used as an additive in accordance with the present invention.

The present invention involves the application of a chemical compound or compounds as an additive in the etching process of silicon wafers. A method in accordance with the present invention may be utilized with any type or orientation of wafer, whether it is standard or custom-made, which is fabricated with silicon. The particular wafers discussed herein are used as examples to point out features of the present invention and are not intended to be limiting in any way. Furthermore, the additive and method of using the additive in accordance with the present invention may be employed to modify any conventional etching process.

In accordance with the present invention, an iodate or a chlorite salt is used as an additive during the caustic etching of silicon which reduces the size of surface features on the wafer, among other things. The beneficial results from using the method of the present invention also include reduction in duration of polishing, which typically follows etching in wafer manufacturing, a smoother back (unpolished) surface and less time required during a subsequent acid etching step, if such step is desired.

The etching of silicon occurs in alkaline medium and the additive of the present invention is not dependent on process conditions (e.g., temperature or hydroxide concentration) to obtain beneficial results. The degree of the size reduction depends, at least in part, on the percentage of the additive used.

For example, using 5% of potassium iodate, the squares on a (100) wafer will generally be approximately one tenth the length of the squares on a wafer etched using standard caustic processes, with 30 μm of Si removed. Generally, as the concentration of potassium iodate is increased, the etch rate is lowered. The use of the additives in accordance with the present invention may be applied under all current conditions (including temperature and KOH/NaOH concentration) typical for caustic etching, with the only limitation being the solubility of an iodate or a chlorite salt.

In a preferred embodiment, the method of the present invention involves the on-site addition of potassium iodate ($KIO_3$), sodium iodate ($NaIO_3$) or lithium iodate ($LiIO_3$) to an etching bath in a manner which utilizes an existing or slightly modified process. The $KIO_3$ or $NaIO_3$ can be used as an additive at any concentration to achieve beneficial effects in accordance with the present invention. However, higher concentrations, such as greater than about 0.5% by weight, are generally preferred because at higher concentrations of additive typically provide greater facet reduction. For example, the method of the present invention has provided beneficial overall results with additive concentrations at about 1%.

Generally, the practical limit for addition of additive in accordance with the present invention is at least partially related to its solubility. For iodate salts, the solubility substantially depends on temperature and NaOH (KOH) concentration. However, the solubility is typically not much higher than about 5%, even at highly elevated temperatures. The room temperature solubilities of alkali metal iodates in KOH or NaOH solutions are much lower than 5%. One beneficial reason to use lower concentrations of additives in a method according to the present invention is to increase the etch rates, closer to the rate obtained without the use of iodates. However, the facet size reduction, and therefore, the reduction in roughness, is less pronounced then when using the method of the present invention with additives at higher concentrations.

Table 1 shown below lists the data obtained from etching typical lapped wafers at about 90° C. in a about 40% KOH solution containing $KIO_3$ at different concentrations ranging from about 0% to about 1%. As shown, when the concentration of $KIO_3$ is increased, a gradual reduction of $R_a$(RMS) is observed from 0.475 (0.640) μm at about 0% to 0.254 (0.339) μm at about 1%. This effect is accompanied by the reduction in etch rate from about 5.1 μm/min. to about 2.0 μm/min.

While a reduced etch rate is undesirable, it is should be recognized that increasing the temperature will also increase the etch rate at each KOH/NaOH concentration, and also each iodate concentration. For example, a silicon wafer manufacturer can replace an etching process at about 90° C. without $KIO_3$ with a new process in accordance with the present invention at about 105° C. and about 1% $KIO_3$ that will yield substantially the same etch rate with the added benefit of reduced roughness and facet size.

In addition, higher temperatures also allow for higher concentrations of $KIO_3$. For example, the solubility limit is just under about 2% $KIO_3$ in about 40% KOH and at about 90° C., but the solubility is higher at temperatures higher than 90° C. Thus, conducting an etching process at higher temperatures in accordance with the present invention would provide even greater than expected results. Generally, higher concentrations of $KIO_3$ offer greater roughness and facet size reductions.

TABLE 1

Etch Results at Different % Values of $KIO_3$ with 25 ± 1 µm Si Removal*

| No. | % of $KIO_3$ used | Si Removal (µm) | Etch Time (min.) | Etch Rate (µm/min.) | Etch Time Factor | $R_a$(RMS) (µm) |
|---|---|---|---|---|---|---|
| 1 | 0 | 25.6 | 5 | 5.1 | 1 | .475(.640) |
| 2 | 0.1 | 24.5 | 6 | 4.1 | 1.3 | .431(.576) |
| 3 | 0.2 | 25.2 | 7.5 | 3.4 | 1.5 | .391(.519) |
| 4 | 0.5 | 24.8 | 10 | 2.5 | 2.1 | .299(.402) |
| 5 | 1.0 | 24.2 | 12 | 2.0 | 2.5 | .254(.339) |
| 6 | ~2 | 24.1 | 14 | 1.7 | 3.0 | .241(.314) |

*in 40% KOH @ 90° C., lapped (100) wafer, $R_a$(RMS) = .218(.300) µm, roughness data from Tencor P-1 contact profiler, 5 mm scan length, 0.1 mm/s scan speed, 25 mg stylus force, 0.15–0.25 stylus diameter, 800 µm cutoff filter.

Figure 2:
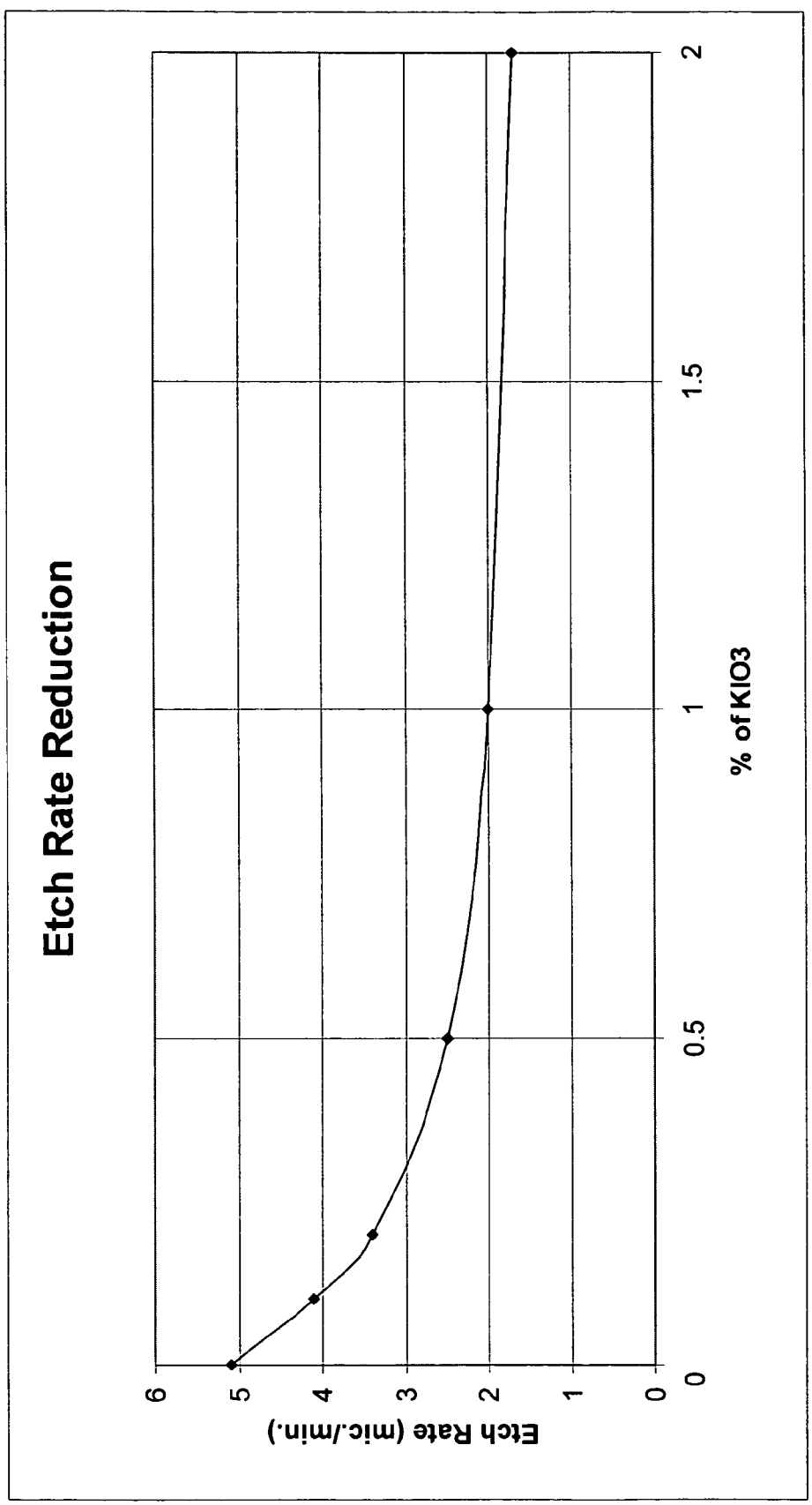
FIG. 2 is a graphical depiction of the data provided in Table 1, illustrating an example of the beneficial results obtained by conducting an etching process according to the method of the present invention, and in particular, the effect of etch rate reduction from using $KIO_3$ used as an additive in accordance with the present invention.

FIGS. 1 and 2 provide graphical representations to illustrate the data in Table 1. As is readily apparent from the figures, both the roughness and etch rate are significantly reduced when using 0.5% of $KIO_3$ and higher concentrations.

Interestingly, iodates appear to be unique in their beneficial effect as an additive in the caustic etching of silicon and no other inorganic chemicals have been found to display similar effects except for sodium chlorite ($NaClO_2$). However, it preferred to use iodates primarily because the effect observed with $NaClO_2$, has typically resulted in a lesser reduction of the feature size. Additionally, inorganic compounds that are the most similar to $KIO_3$, such as potassium chlorate ($KClO_3$), potassium bromate ($KBrO_3$), and potassium periodate ($KIO_4$), and $I_2$ or combinations of compounds containing iodine that differ from iodate, do not display the same beneficial effect as an additive when used in the method of the present invention.

The present invention is also directed to an embodiment in which a chemical reaction between an iodine-containing species, which is not beneficial to the etching process on its own, and another chemical (or chemicals), can react to form iodate in solution, and thus, be used for etching. One obvious example is iodic acid ($HIO_3$), which is converted to iodate in KOH or NaOH solutions. Furthermore, iodates can be obtained by the oxidation of $I_2$ with chlorate.

While not wanting to be limited to one particular theory, this behavior suggests that the rate of redox reaction under the process conditions is what distinguishes iodates from other halogen containing oxidizers. Iodates, although less thermodynamically potent than most of these oxidizers, have been found to display higher redox reaction rates. The typical rate orders are: chlorate<bromate<iodate and periodate<iodate. Thus, although weaker oxidizers, iodates appear likely to be the fastest oxidizers in the group, and this is believed to be at least part of the reason for their effectiveness. Notably, sodium chlorite appears to show some, although limited beneficial effects as an additive. This may be partially related to its reaction rate, which is faster than that of other similar chlorate salts, and approaches the rates of iodate salts. The reaction itself can occur between the iodate and silicon or between the iodate and hydrogen (especially monoatomic, in-statu nascendi hydrogen) produced from the reaction between KOH/NaOH and silicon.

The ease and simplicity of using an additive in an etching process in accordance with the present invention is described in the following exemplary embodiment in which iodate is used as the additive. First, an initial etching bath solution with the desired percentage of an iodate salt is prepared. Then, as the iodate salt is depleted it may be replenished by the addition of more iodate. The iodate may be added as either a solid, an aqueous solution, or a slurry of the iodate salt with a suspending agent such as a thick polymer solution. For delivery as an aqueous solution, using $HIO_3$ or $LiIO_3$ is particularly attractive due to their high solubility in water at room temperature (~70% and 40%, respectively), although other solutions may be used also. The solubility of $LiIO_3$ in concentrated hydroxide solution is the same as of other iodate salts because the hydroxide counter cation ($K^+$ in KOH) levels the solubilities. For example, $LiIO_3$ and $NaIO_3$ dissolved in KOH precipitate as $KIO_3$, if the solubility product, $K_{sp}$, of the latter is exceeded.

It is preferably to maintain a high iodate concentration during the etching process. The greatest control of the iodate concentration in the etching process occurs when using a saturated solution (i.e., if excess salt is present at all times during etching). One manner in which this can be achieved in accordance with the present invention is by simply adding a small amount of solid iodate to the saturated solution and maintaining the presence of the solid by any commonly known or customized methods. Other methods may be used, such as for example, a suspended iodate tablet can be used effectively to serve the same purpose if a floating solid is undesirable.

Alternatively, a modified recirculation method can be used to saturate the solution through contact with solid iodate in an external loop. In another embodiment, the present invention is directed to a method and apparatus for conducting a caustic etching process of silicon, wherein the etching process solution is saturated with iodate by periodic exposure thereto. The periodic exposure can be achieved by a continuous recirculating system in which etching process solution is removed from the etching process of a silicon substrate, brought into a separate chamber containing iodate in any conventional arrangement, such as in iodate bed, so that the solution contacts the iodate and is returned to the etching process thereafter.

Although the method of the present invention has been described with respect to preferred and exemplary embodiments, those skilled in the art will readily appreciate that changes and modifications may be made thereto without departing from the spirit and scope of the present invention.

What is claimed is:

1. A method for producing silicon wafers with improved surface features, comprising the steps of:
    (a) supplying a substrate fabricated substantially of silicon;
    (b) exposing the substrate to an etching bath containing a caustic etching solution including an additive, wherein the additive is potassium iodate, sodium iodate or a mixture thereof;
    (c) removing a portion of the solution from the etching bath;
    (d) exposing the portion of removed solution to the additive;
    (e) returning the exposed portion of removed solution to the etching bath; and
    (f) etching the substrate in the etching bath to form the improved surface features.

2. A method according to claim 1, wherein the additive is potassium iodate.

3. A method according to claim 1, wherein the additive is sodium iodate.

4. A method according to claim 1, wherein the additive has an additive concentration of at least about 0.01% by weight.

5. A method according to claim 1, further comprising the step of forming the additive by chemical reaction in the etching bath.

6. A method according to claim 1, further comprising the step of forming the additive by a reaction in the etching bath between iodic acid and hydroxide.

7. A method according to claim 1, further comprising the step of forming the additive by an oxidation of $I_2$ with chlorate in the etching bath.

8. A method according to claim 1, wherein the additive is sodium chlorite.

9. A method according to claim 1, wherein the additive includes lithium iodate.

10. A method according to claim 1, wherein the additive includes an alkaline medium.

11. A method according to claim 1, further comprising the step of:
    replenishing the additive by adding more iodate salt as the iodate salt is depleted.

12. A method according to claim 11, wherein the additional iodate salt is selected from the group consisting of a solid, an aqeous solution and a slurry of the additional iodate salt with a suspending agent.

13. A method for producing silicon wafers with improved surface features, comprising the steps of:
    (a) supplying a substrate fabricated substantially of silicon;
    (b) exposing the substrate to an etching bath containing a caustic etching solution including an additive, wherein the additive is a chlorite salt, an iodate salt, or a mixture thereof;
    (c) removing a portion of the solution from the etching bath;
    (d) exposing the portion of removed solution to the additive;
    (e) returning the exposed portion of removed solution to the etching; and
    (f) etching the substrate in the etching bath to form the improved surface features.

* * * * *